United States Patent
Zang et al.

(10) Patent No.: US 11,476,290 B2
(45) Date of Patent: Oct. 18, 2022

(54) METAL DEEP TRENCH ISOLATION BIASING SOLUTION

(71) Applicant: OMNIVISION TECHNOLOGIES, INC., Santa Clara, CA (US)

(72) Inventors: Hui Zang, San Jose, CA (US); Gang Chen, San Jose, CA (US); Kenny Geng, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 285 days.

(21) Appl. No.: 16/918,929

(22) Filed: Jul. 1, 2020

(65) Prior Publication Data

US 2022/0005849 A1    Jan. 6, 2022

(51) Int. Cl.
*H01L 27/146* (2006.01)
*H04N 5/378* (2011.01)

(52) U.S. Cl.
CPC ...... *H01L 27/1463* (2013.01); *H01L 27/1464* (2013.01); *H01L 27/14621* (2013.01); *H01L 27/14627* (2013.01); *H01L 27/14643* (2013.01); *H04N 5/378* (2013.01)

(58) Field of Classification Search
CPC .......... H01L 27/1463; H01L 27/14621; H01L 27/14627; H01L 27/1464; H01L 27/14643
See application file for complete search history.

(56) References Cited

U.S. PATENT DOCUMENTS

2020/0077055 A1    3/2020 Kim et al.

*Primary Examiner* — Marvin Payen
(74) *Attorney, Agent, or Firm* — Perkins Coie LLP

(57) ABSTRACT

An image sensor includes photodiodes disposed in a pixel region and proximate to a front side of a semiconductor layer. A backside metal grating is formed in a backside oxide layer disposed proximate to a backside of the semiconductor layer. A deep trench isolation (DTI) structure with a plurality of pixel region portions and an edge region portion is formed in the semiconductor layer. The pixel region portions are disposed in the pixel region of the semiconductor layer such that incident light is directed through the backside metal grating, through the backside of the semiconductor layer, and between the pixel region portions of the DTI structure to the photodiodes. The edge region portion of the DTI structure is disposed in an edge region outside of the pixel region. The edge region portion of the DTI structure is biased with a DTI bias voltage.

47 Claims, 9 Drawing Sheets

METAL DEEP TRENCH ISOLATION BIASING SOLUTION

BACKGROUND INFORMATION

Field of the Disclosure

This disclosure relates generally to image sensors, and in particular but not exclusively, relates to complementary metal oxide semiconductor (CMOS) image sensors with deep trench isolation structures.

Background

Image sensors have become ubiquitous and are now widely used in digital cameras, cellular phones, security cameras, as well as, medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (i.e., image data) representing the external scene. One of the sources of noise in an image sensor is caused by dark current. The dark current is current that is generated in the absence of light or in the dark. Thus, a reduction in dark current will result in the reduction of noise and therefore improve image sensor performance.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
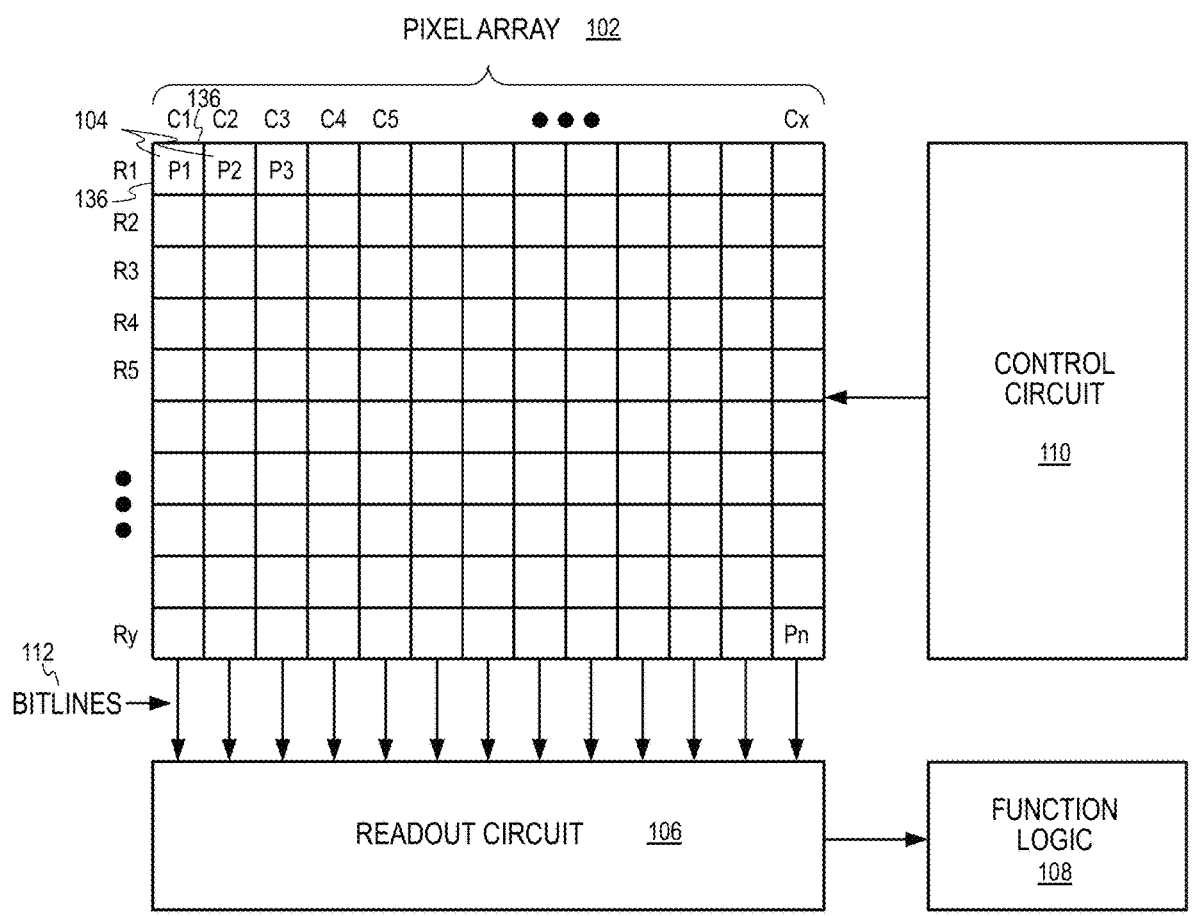
FIG. 1 illustrates one example of an imaging system including an image sensor with a deep trench isolation structure that is biased to reduce dark current in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system including a biased deep trench isolation structure that reduces dark current are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with an image sensor including a deep trench isolation (DTI) structure that is biased to reduce dark current are described. In the various examples, the image sensor includes a semiconductor layer with a pixel region in which photodiodes and associated pixel circuitry are formed. A DTI structure is also formed in the semiconductor layer. Portions of the DTI structure are formed in the pixel region of the semiconductor layer to provide isolation between the photodiodes. In addition, a portion of the DTI structure is also formed in an edge region or peripheral region of the semiconductor layer, which is outside of the pixel region. In the various examples, the DTI structure is biased with a DTI bias voltage that creates an electric field between the DTI structure and the semiconductor layer, which reduces dark current and/or white pixels in the image sensor in accordance with the teachings of the present invention. In the various examples, the DTI structure may be biased with a contact through a backside metal grating and through the backside of the semiconductor layer. In another example, the DTI structure may be biased through a metal layer through a front side of the semiconductor layer in accordance with the teachings of the present invention.

To illustrate, FIG. 1 illustrates one example of a complementary metal oxide semiconductor (CMOS) imaging system 100 with an image sensor including a DTI structure that is biased to reduce dark current in accordance with the teachings of the present invention. As shown in the depicted example, the imaging system 100 includes an image sensor with pixel array 102, a control circuit 110, a readout circuit 106, and function logic 108. In one example, pixel array 102 is a two-dimensional (2D) array with a plurality of photodiodes included in pixel cells 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc. As shown in the illustrated example, the pixel cells 104 with the included photodiodes are separated or isolated from each other by a DTI structure 136, which includes portions that are disposed between the pixel cells 104. As will be described in greater detail below, the portions of DTI structure 136 shown in FIG. 1 between the pixel cells 104 are in a pixel region of a semiconductor layer. In the various example, the DTI structure also includes a portion that is disposed in an edge region or peripheral region of the semiconductor layer outside of the pixel region. The DTI structure is biased with a DTI bias voltage that creates an electric field between the DTI structure 136 and the semiconductor layer, which reduces dark current and/or white pixels in the image sensor in accordance with the teachings of the present invention.

After the photodiodes of pixel cells 104 have acquired their image charge, the corresponding analog image signals are read out by readout circuit 106 through column bitlines 112. In the various examples, readout circuit 106 includes an analog-to-digital conversion (ADC) circuit 114, which is coupled to convert the analog image signals received from the pixel cells 104 through bitlines 112 to digital image signals, which may be then transferred to function logic 108. Function logic 108 may simply store the image data or even manipulate the image data by applying post image processing or effects. Such image processing may, for example, include image processing, image filtering, image extraction and manipulation, determination of light intensity, crop, rotate, remove red eye, adjust brightness, adjust contrast, etc.

In one example, a control circuit 110 is coupled to pixel array 102 to control operational characteristics of pixel array 102. For instance, in one example, control circuit 110 generates the transfer gate signals and other control signals to control the transfer and readout of image data from all of the pixel cells 104 of pixel array 102. In addition, control circuit 110 may generate a shutter signal for controlling image acquisition. In one example, the shutter signal is a rolling shutter signal such that each row of the pixel array 102 is read out sequentially row by row during consecutive acquisition windows. The shutter signal may also establish an exposure time, which is the length of time that the shutter remains open. In one embodiment, the exposure time is set to be the same for each of the frames.

Figure 2:
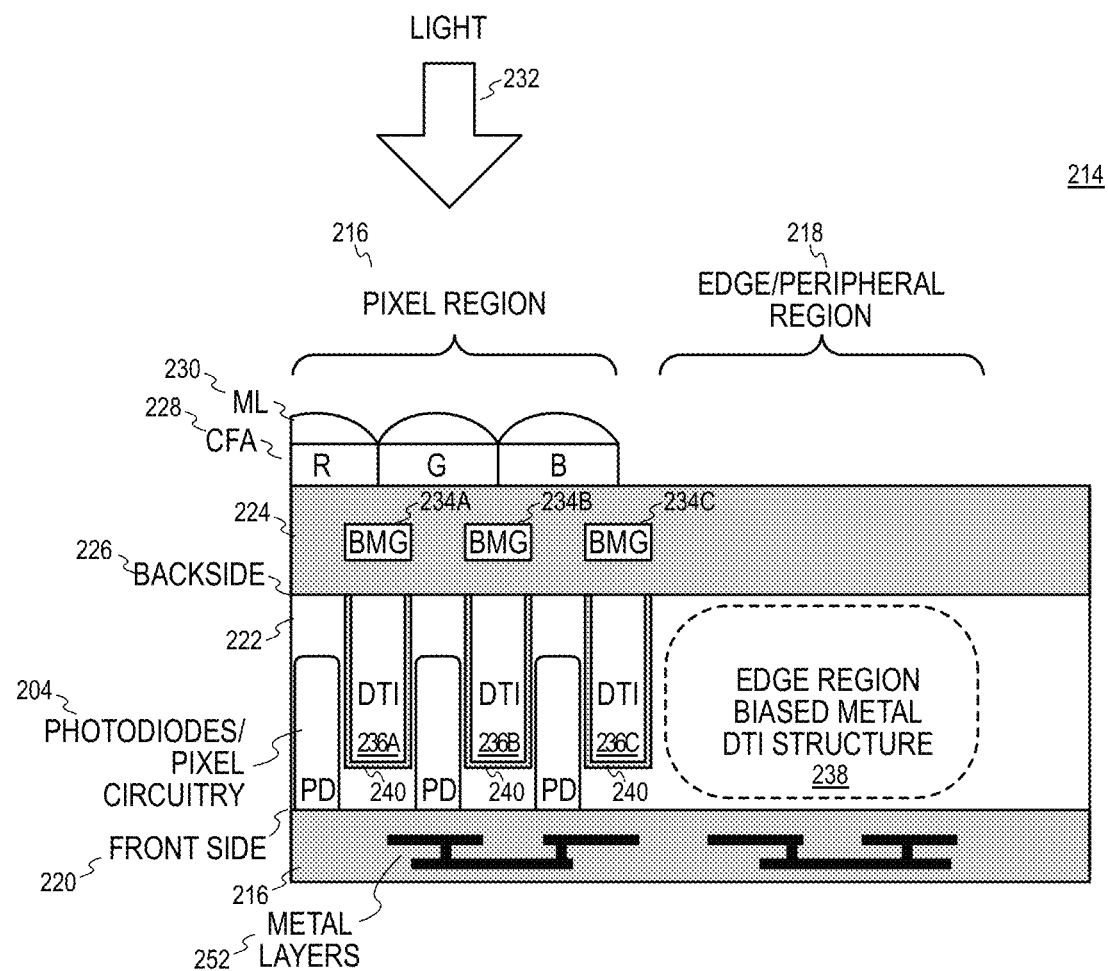
FIG. 2 is a cross-section view illustrating one example of an image sensor including a biased deep trench isolation structure in accordance with the teachings of the present invention.

FIG. 2 is a cross-section view illustrating one example of an image sensor 214 including a biased DTI structure in accordance with the teachings of the present invention. In the example, the image sensor 214 includes a plurality of photodiodes (PD) 204 included in pixel circuitry, which are formed proximate to a front side 220 in a pixel region 216 of a semiconductor layer 222. It is noted that example image sensor 214 including the photodiodes 204 of the pixel circuitry referred to in FIG. 2 are an example of the image sensor including the pixel cells 104 of the example pixel array 102 of FIG. 1, and it should be appreciated that similarly named and numbered elements referenced below are coupled and function as described above.

Continuing with the example depicted in FIG. 2, image sensor 214 further includes a backside oxide layer 224 disposed proximate to a backside 226 of the semiconductor layer 222. A backside metal grating (BMG) is formed in the backside oxide layer 224. As shown in the illustrated example, the BMG includes a plurality of BMG pixel region portions 234A, 234B, 234C in the pixel region 216. In the example, a color filter array (CFA) 228 is formed over the backside oxide layer 224, and microlenses (ML) 230 formed over the CFA 228 in the pixel region 216. A dielectric layer 216 is disposed proximate to the front side 220 of the semiconductor layer 222. In the example, the dielectric layer 216 is an interlayer dielectric in which a plurality of metal layers 252 are formed to provide circuit connections for the circuitry included in the semiconductor layer 222.

The example illustrated in FIG. 2 also shows that image sensor 214 includes a DTI structure formed in the semiconductor layer 222. The DTI structure includes a plurality of pixel region portions 236A, 236B, 236C formed in the pixel region 216 for semiconductor material 222. The DTI structure also includes an edge region portion 238 disposed in an edge region 218 or a peripheral region of the semiconductor layer 222, which is outside of the pixel region 216 of the semiconductor layer 222. In the various examples, the DTI structure including pixel region portions 236A, 236B, 236C and edge region portion 238 are formed with a suitable metal material (e.g., copper (Cu), aluminum (Al), tungsten (W), or other suitable conductive material) with an oxide layer 240 disposed between the metal material of the DTI structure and the semiconductor material (e.g., silicon (Si)) of the semiconductor layer 222. In the various examples, the DTI structure is coupled to be biased with a DTI bias voltage, which creates an electric field in the semiconductor layer 222 that reduces dark current (DC) and/or white pixels (WP) in the image sensor 214 in accordance with the teachings of the present invention. In one example, the DTI bias voltage is a negative voltage.

As mentioned above, it is reminded that various elements including for example photodiodes 204 and DTI structure portions 236A, 236B, 236C, 238 have not necessarily been drawn to scale. For example, the dimensions of some of the elements in the figures may be exaggerated relative to other elements to help to improve understanding of various embodiments of the present invention. For instance, in various examples, it is appreciated that photodiodes 204 may be 10 times wider than pixel region portions 236A, 236B, 236C of the DTI structure in one actual implementation.

Each of the plurality of pixel region portions 236A, 236B, 236C of the DTI structure is disposed as shown in the pixel region 216 and aligned with the ML 238, CFA 228, BMG pixel region portions 234A, 234B, 234C and photodiodes 204 in the semiconductor layer 222 such that incident light 232 is directed through the ML 230, CFA 228, backside metal grating 234A, 234B, 234C, through the backside 226, and between the plurality of pixel region portions 236A, 236B, 236C of the DTI structure to the photodiodes 204 of the pixel circuitry at the front side 220 of the semiconductor layer 222.

Figure 3A:
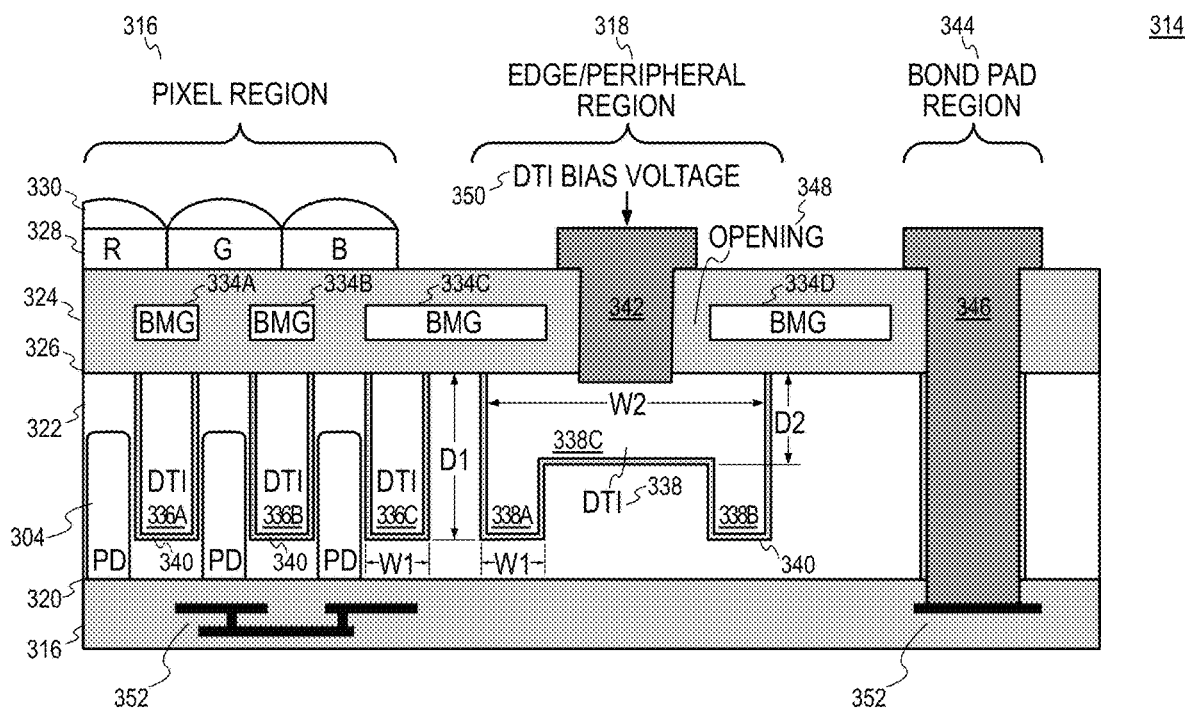
FIG. 3A is a cross-section view illustrating another example of an image sensor including a biased deep trench isolation structure in accordance with the teachings of the present invention.

FIG. 3A is a cross-section view illustrating another example of an image sensor 314 including a biased DTI structure in accordance with the teachings of the present invention. It is noted that example image sensor 314 of FIG. 3A may be an example of the image sensor 214 including the photodiodes 204 of the pixel circuitry of FIG. 2 and/or the example image sensor including the pixel cells 104 of the example pixel array 102 of FIG. 1, and it should be appreciated that similarly named and numbered elements referenced below are coupled and function as described above.

As shown in the example depicted in FIG. 3A, image sensor 314 includes a plurality of photodiodes 304 included in pixel circuitry, which are formed proximate to a front side 320 in a pixel region 316 of a semiconductor layer 322. The image sensor 314 further includes a backside oxide layer 324 disposed proximate to a backside 326 of the semiconductor layer 322. A backside metal grating (BMG) is formed in the backside oxide layer 324. As shown in the illustrated example, the BMG includes a plurality of BMG pixel region portions 334A, 334B, 334C in the pixel region 316. The BMG further includes portions 334C and 334D that are in an edge region 318 or peripheral region. In the depicted example, it is noted that portion 334C may overlap with both the pixel region 316 and the edge region 318 as shown. The example depicted in FIG. 3A also illustrates that an opening 348 or window is formed in the BMG between BMG portions 334C and 334D. In the example, a color filter array (CFA) 328 is formed over the backside oxide layer 324, and microlenses (ML) 330 are formed over the CFA 328 in the pixel region 316. A dielectric layer 316 is disposed proximate to the front side 320 of the semiconductor layer 322. In the example, the dielectric layer 316 is an interlayer dielectric in which a plurality of metal layers 352 are formed to provide circuit connections for the circuitry included in the semiconductor layer 322.

The example illustrated in FIG. 3A also shows that image sensor 314 includes a DTI structure formed in the semiconductor layer 322. The DTI structure includes a plurality of pixel region portions 336A, 336B, 336C, and an edge region portion 338. The plurality of pixel region portions 336A, 336B, 336C of the DTI structure is disposed in the pixel region 316 of the semiconductor layer 322. In one example, the plurality of pixel region portions 336A, 336B, 336C have a first width W1 and extend a first depth D1 into the semiconductor layer 322 from the backside 326 towards the front side 320. In one example, the first width W1 is approximately equal to 120 nm and the first depth D1 is approximately equal to 1.5 μm. In other examples, it is appreciated that the widths and depths of such features may have other values. The edge region portion 338 of the DTI structure is disposed in an edge region 318 of the semiconductor layer 322, which is outside of the pixel region 316 of the semiconductor layer 322.

Each of the plurality of pixel region portions 336A, 336B, 336C of the DTI structure is disposed as shown in the pixel region 316 and aligned with the ML 338, CFA 328, BMG pixel region portions 334A, 334B, 334C and photodiodes 304 in the semiconductor layer 322 such that incident light is directed through the ML 330, CFA 328, backside metal grating 334A, 334B, 334C, through the backside 326, and between the plurality of pixel region portions 336A, 336B, 336C of the DTI structure to the photodiodes 304 of the pixel circuitry at the front side 320 of the semiconductor layer 322.

The depicted example of FIG. 3A also illustrates that image sensor 314 includes an edge DTI contact 342, which is coupled to the edge region portion 338 of the DTI structure through the opening 348 between the edge region portions 334C and 334D of the backside metal grating in the backside oxide layer 324 and through the backside 326 of the semiconductor layer 322. The edge region portion 338 of the DTI structure is coupled to be biased with a DTI bias voltage 350 through the edge DTI contact 342, which creates an electric field with DTI structure 336A, 336B, 336C, 338 in the semiconductor layer 322 that reduces dark current (DC) and/or white pixels (WP) in the image sensor 314 in accordance with the teachings of the present invention. In one example, the DTI bias voltage 350 is a negative voltage.

In the illustrated example, it is noted that there may also be a bond pad region 344 at the side of the image sensor 314 as shown. In one example, the bond pad region 344 includes a bond pad contact 346 that extends through the semiconductor layer 322 between the backside oxide layer 324 at the backside 326 and a metal layer 352 in the dielectric layer 316 at the front side 320. In the example, the edge region 318 is between the pixel region 316 and the bond pad region 344 as shown.

In the example illustrated in FIG. 3A, the edge region portion of the DTI structure 338 includes a plurality of first portions 338A and 338B, and a second portion 338C. Each of the plurality of first portions 338A and 338B of the edge region portion 338 of the DTI structure extends a first depth D1 from the backside 326 of the semiconductor layer 322 towards the front side 320 of the semiconductor layer 322. The second portion 338C of the edge region portion 338 of the DTI structure extends a second depth D2 from the backside 326 of the semiconductor layer 322 towards the front side 320 of the semiconductor layer 322. As shown in the example, the first depth D1 is greater than the second depth D2. Therefore, it is appreciated that the example edge region portion 338 of the DTI structure has the shape of a "table" of which the first portions 338A and 338B may resemble the "legs" and the second portion 338C may resemble the "tabletop." In one example, the "leg" portions 338A and 338B have a width approximately equal to the first width W1 of 120 nm, and the "tabletop" portion or second portion 338C has a second width W2, which in one example is in the range of 1 to 40 μm. It is also noted that in the depicted example, both the first depth D1 and the second depth D2 are less than a total thickness of the semiconductor layer 322 between the backside 326 and the front side 320. In one example, the first depth D1 of the first portions 338A and 338B is the same depth of the plurality of pixel region portions 336A, 336B, 336C of the DTI structure in the pixel region 316. It is appreciated that the example depths and widths summarized above are provided for explanation purposes and that in other examples, the example depths and widths may have different values.

In the various examples, the DTI structure including pixel region portions 336A, 336B, 336C and edge region portion 338 are formed with a suitable metal material (e.g., copper (Cu), aluminum (Al), tungsten (W), or other suitable conductive material) with an oxide layer 340 disposed between the metal material of the DTI structure and the semiconductor material (e.g., silicon (Si)) of the semiconductor layer 322. In the various examples, the metal of the edge region portion 338 may be formed with the same type of metal or may be formed with a different type of metal as the other pixel region portions 336A, 336B, 336C of the DTI structure.

Figure 3B:
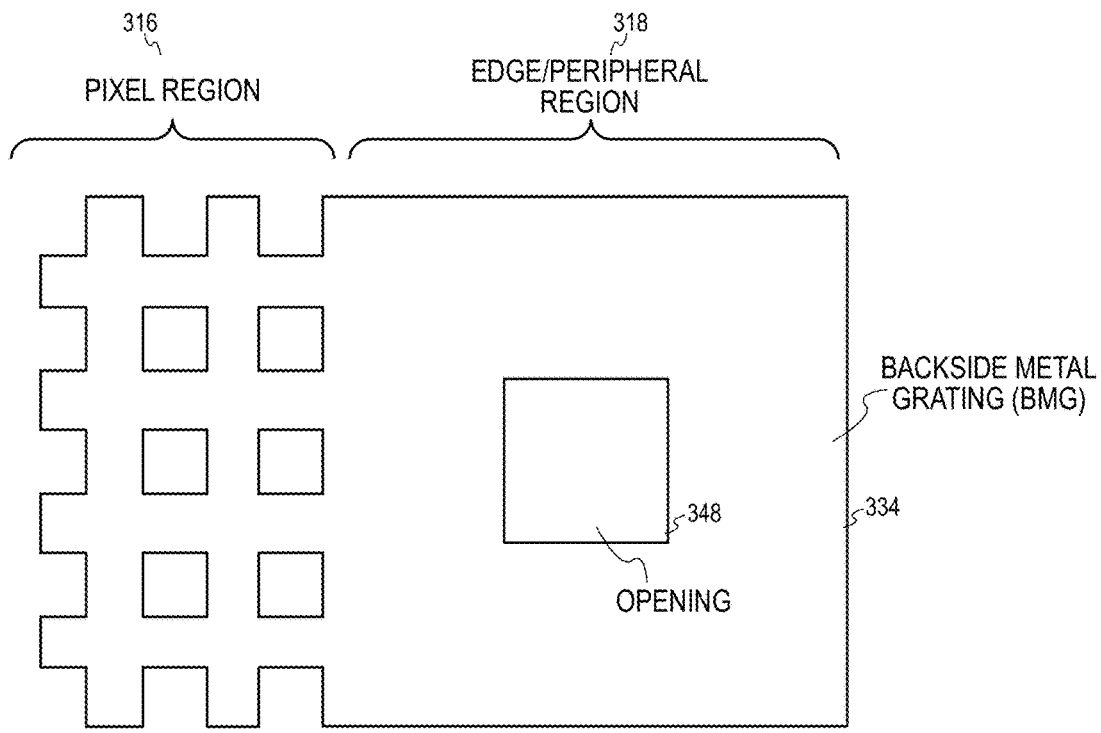
FIG. 3B is a top view illustrating various portions one example of a backside metal grating of an image sensor in accordance with the teachings of the present invention.

FIG. 3B is a top view illustrating various portions of one example of a backside metal grating 334 of an image sensor in accordance with the teachings of the present invention. It is noted that example backside metal grating 334 of FIG. 3B may be an example of the same backside metal grating 334 of FIG. 3A but viewed from a different perspective. Accordingly, it should be appreciated that similarly named and numbered elements referenced below are coupled and function as described above.

As shown in the example depicted in FIG. 3B, backside metal grating 334 includes a pixel region 316 portion and an edge region 318 portion, or peripheral region portion. As discussed above in FIG. 3A, the backside metal grating 334 is formed in the backside oxide layer 324 with the pixel region 316 portion aligned with and formed over the photodiodes 304 and the pixel region portions 336A, 336B, 336C of the DTI structure. In the illustrated example, it is noted that the pixel region 316 portion of backside metal grating 334 is formed in a grid shape with openings that are aligned with the underlying photodiodes 304 in the semiconductor layer 322 so that incident light can be directed through the openings in the backside metal grating 334 to the photodiodes 304.

The example depicted in FIG. 3B also shows that the edge region 318 portion of backside metal grating 334 includes a opening 348 that is aligned with the underlying edge region portion 338 of the DTI structure in the semiconductor layer 322. As such, the edge DTI contact 342 can be directed through the opening 348 in the backside metal grating 334 to the underlying edge region portion 338 of the DTI structure in the semiconductor layer 322.

Figure 3C:
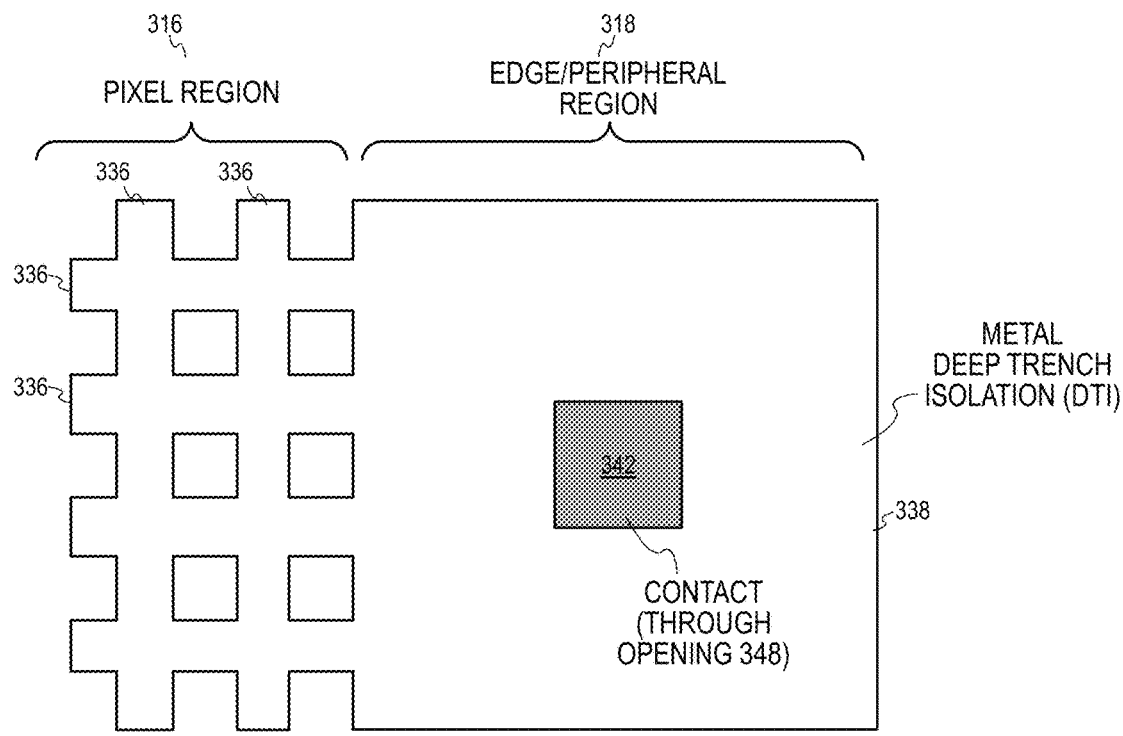
FIG. 3C is a top view illustrating various portions of one example of a deep trench isolation structure of an image sensor in accordance with the teachings of the present invention.

FIG. 3C is a top view illustrating various portions of one example of a DTI structure 336, 338 of an image sensor in accordance with the teachings of the present invention. It is noted that example DTI structure 336, 338 of FIG. 3C may be an example of the same DTI structure 336A, 336B, 336C, 338 of FIG. 3A but viewed from a different perspective. Accordingly, it should be appreciated that similarly named and numbered elements referenced below are coupled and function as described above.

As shown in the example depicted in FIG. 3C, DTI structure 336, 338 includes a pixel region 316 portion and an edge region 318 portion, or peripheral region portion. As discussed above in FIG. 3A, the DTI structure 336, 338 is formed in the semiconductor layer 322 with the portions 336 of the DTI structure in pixel region 316 portion aligned with the photodiodes 304 and the pixel region portions 334A, 334B, 334C of the backside metal grating. As shown in the illustrated example, it is noted that the pixel region 316 portions 336 of the DTI structure are formed in a grid shape with openings that are aligned with the photodiodes 304 in the semiconductor layer 322 so that incident light can be directed through the openings between the DTI structure portions 336 to the photodiodes 304.

The example depicted in FIG. 3C also shows that the edge region 318 portion 334 of DTI structure is coupled to the edge DTI contact 342, which is aligned with and directed through the opening 348 in the backside metal grating 334 as discussed above in FIGS. 3A-3B. As such, the edge DTI contact 342 coupled to the edge region 318 portion 334 of DTI structure and is be coupled to receive the DTI bias voltage 350 to generate the electric field with DTI structure 336, 338 in the semiconductor layer 322 to reduce dark current and/or white pixels in the image sensor in accordance with the teachings of the present invention.

Figure 4:
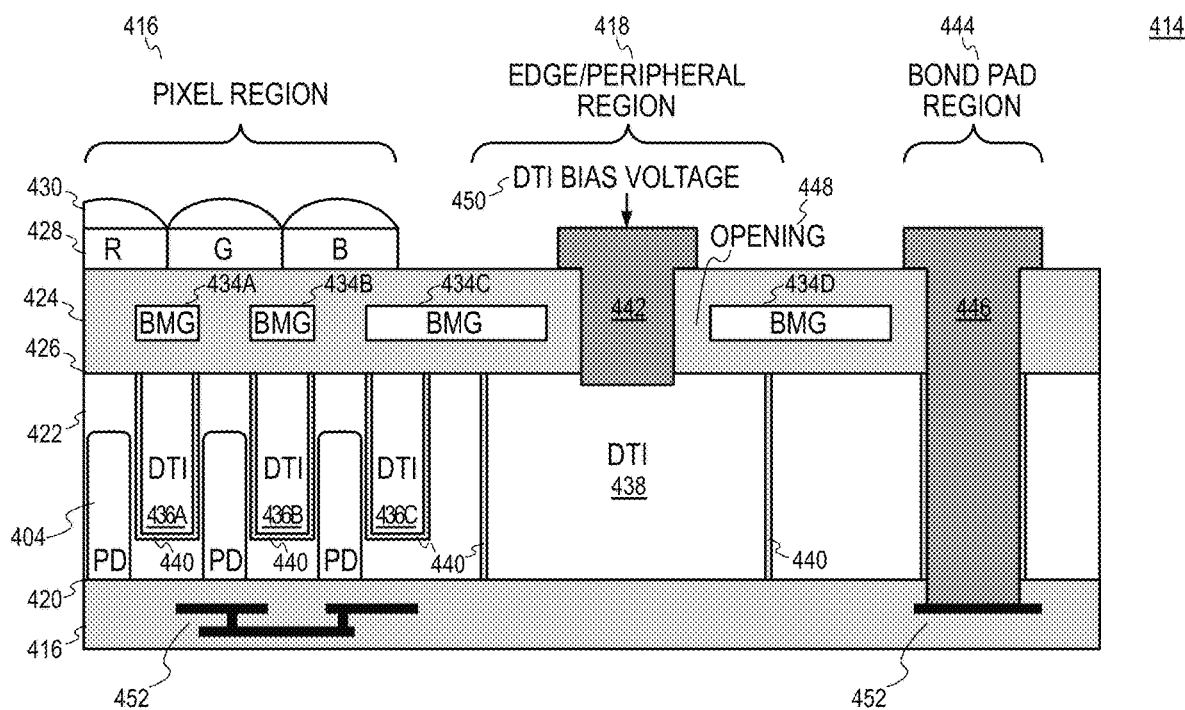
FIG. 4 is a cross-section view illustrating yet another example of an image sensor including a biased deep trench isolation structure in accordance with the teachings of the present invention.

FIG. 4 is a cross-section view illustrating yet another example of an image sensor 414 including a biased DTI structure in accordance with the teachings of the present invention. It is noted that example image sensor 414 of FIG. 4 may be another example of the image sensor 214 including the photodiodes 204 of the pixel circuitry of FIG. 2 and/or the example image sensor including the pixel cells 104 of the example pixel array 102 of FIG. 1, and it should be appreciated that similarly named and numbered elements referenced below are coupled and function as described above. It is further noted that image sensor 414 of FIG. 4 shares many similarities with image sensor 314 of FIGS. 3A-3C.

For instance, as shown in the example depicted in FIG. 4, image sensor 414 also includes a plurality of photodiodes 404 included in pixel circuitry, which are formed proximate to a front side 420 in a pixel region 416 of a semiconductor layer 422. The image sensor 414 further includes a backside oxide layer 424 disposed proximate to a backside 426 of the semiconductor layer 422. A backside metal grating (BMG) is formed in the backside oxide layer 424. As shown in the illustrated example, the BMG includes a plurality of BMG pixel region portions 434A, 434B, 434C in the pixel region 416. The BMG further includes portions 434C and 434D that are in an edge region 418 or peripheral region. In the depicted example, it is noted that portion 434C may overlap with both the pixel region 416 and the edge region 418 as shown. The example depicted in FIG. 4 also illustrates that an opening 448 or window is formed in the BMG between BMG portions 434C and 434D. In the example, a color filter array (CFA) 428 is formed over the backside oxide layer 424, and microlenses (ML) 430 are formed over the CFA 428 in the pixel region 416. A dielectric layer 416 is disposed proximate to the front side 420 of the semiconductor layer 422. In the example, the dielectric layer 416 is an interlayer dielectric in which a plurality of metal layers 452 are formed to provide circuit connections for the circuitry included in the semiconductor layer 422.

Similar to the example image sensor 314 shown in FIG. 3A, the example image sensor 414 illustrated in FIG. 4 also includes a DTI structure formed in the semiconductor layer 422. The DTI structure includes a plurality of pixel region portions 436A, 436B, 436C, and an edge region portion 438. The plurality of pixel region portions 436A, 436B, 436C of the DTI structure is disposed in the pixel region 416 of the semiconductor layer 422.

As shown in the depicted example, each of the plurality of pixel region portions 436A, 436B, 436C of the DTI structure is disposed in the pixel region 416 and aligned with the ML 438, CFA 428, BMG pixel region portions 434A, 434B, 434C and photodiodes 404 in the semiconductor layer 422 such that incident light is directed through the ML 430, CFA 428, backside metal grating 434A, 434B, 434C, through the backside 426, and between the plurality of pixel region portions 436A, 436B, 436C of the DTI structure to the photodiodes 404 of the pixel circuitry at the front side 420 of the semiconductor layer 422.

The example image sensor 414 of FIG. 4 also includes an edge region portion 438 of the DTI structure that is disposed in an edge region 418 of the semiconductor layer 422, which is outside of the pixel region 416 of the semiconductor layer 422. One difference between the image sensor 414 of FIG. 4 and the image sensor 314 of FIG. 3A is that the edge region portion 438 of the DTI structure in image sensor 414 extends from between the backside 426 and the front side 420 of the semiconductor layer 422. In other words, the edge region portion 438 of the DTI structure in image sensor 414 has a depth that extends across the entire thickness of the semiconductor layer 422.

Similar to the example image sensor 314 shown in FIG. 3A, the example image sensor 414 illustrated in FIG. 4 also shows that image sensor 414 includes an edge DTI contact 442, which is coupled to the edge region portion 438 of the DTI structure through the opening 448 between the edge region portions 434C and 434D of the backside metal grating in the backside oxide layer 424 and through the backside 426 of the semiconductor layer 422.

In the various examples, the DTI structure including pixel region portions 436A, 436B, 436C and edge region portion 438 are formed with a suitable metal material (e.g., copper (Cu), aluminum (Al), tungsten (W), or other suitable conductive material) with an oxide layer 440 disposed between the metal material of the DTI structure and the semiconductor material (e.g., silicon (Si)) of the semiconductor layer 422. In the various examples, the metal of the edge region portion 438 may be formed with the same type of metal or may be formed with a different type of metal as the other pixel region portions 436A, 436B, 436C of the DTI structure.

The edge region portion 438 of the DTI structure is coupled to be biased with a DTI bias voltage 450 through the edge DTI contact 442, which creates an electric field with DTI structure 436A, 436B, 436C, 438 in the semiconductor layer 422 that reduces dark current (DC) and/or white pixels (WP) in the image sensor 414 in accordance with the teachings of the present invention. In one example, the DTI bias voltage 450 is a negative voltage.

In the illustrated example, it is noted that there may also be a bond pad region 444 at the side of the image sensor 414 as shown. In one example, the bond pad region 444 includes a bond pad contact 446 that extends through the semiconductor layer 422 between the backside oxide layer 424 at the backside 426 and a metal layer 452 in the dielectric layer 416 at the front side 420. In the example, the edge region 418 is between the pixel region 416 and the bond pad region 444 as shown.

FIGS. 5A-5J illustrate cross-section views of an example process for providing an example image sensor 514 including a biased DTI structure at various stages of fabrication in accordance with the teachings of the present invention. It should be noted that the method of fabricating image sensor 514 illustrated in FIGS. 5A-5J only describes one part of the image sensor fabrication process. Several steps have been omitted in order to avoid obscuring certain aspects. The order in which some or all of FIGS. 5A-5J illustrate the various stages of fabricating image sensor 514 should not be deemed limiting. Rather, one of ordinary skill in the art having the benefit of the present disclosure will understand that the illustrated stages of fabricating image sensor 514 shown in FIGS. 5A-5J may occur in a variety of orders not illustrated, or even in parallel.

Figure 5A:
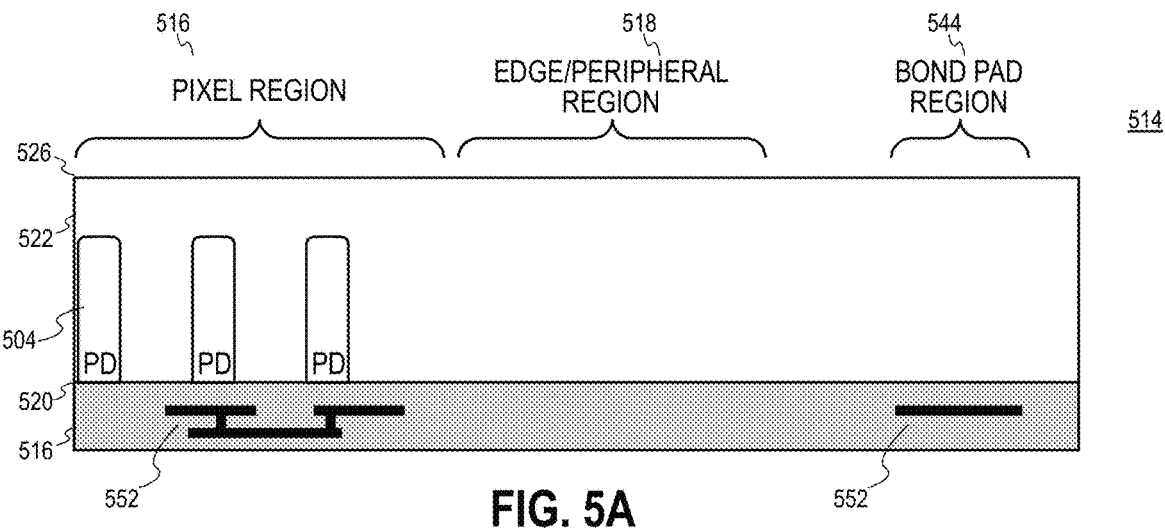
FIGS. 5A-5J illustrate cross-section views of an example process for providing example image sensors including a biased deep trench isolation structure in accordance with the teachings of the present invention.

The example shown in FIG. 5A depicts providing a semiconductor layer 522 including a plurality of photodiodes 544 disposed in a pixel region of the semiconductor layer 522 and proximate to a front side 520 of the semiconductor layer 522 to generate image charge in response to incident light. In the depicted example, a dielectric layer 516 is disposed proximate to the front side 520 of the semiconductor layer 522. In the example, the dielectric layer 516 is an interlayer dielectric in which a plurality of metal layers 552 are formed to provide circuit connections for the circuitry included in the semiconductor layer 522.

Figure 5B:
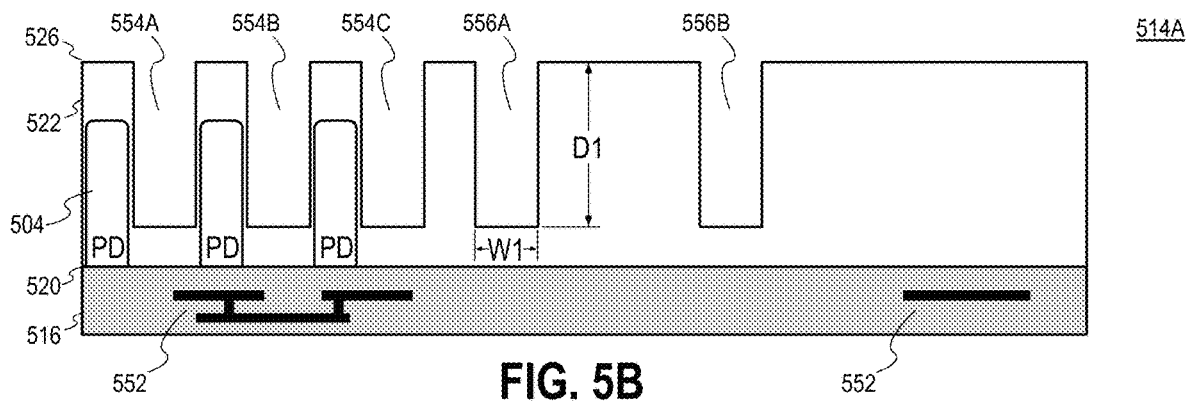

The example shown in FIG. 5B illustrates an example image sensor 514A, which corresponds to the example image sensor 314 of FIG. 3A. As shown, FIG. 5B depicts etching a plurality of trenches 554A, 554B, 554C, 556A, 556B in the semiconductor layer 522. A pixel region portion of the plurality of trenches 554A, 554B, 554C is etched in a pixel region 516 of the semiconductor layer 522. An edge region portion of the plurality of trenches 556A, 556B is etched in an edge region 518 of the semiconductor layer 518 outside of the pixel region 516 of the semiconductor layer 522. In one example, the plurality of trenches 554A, 554B, 554C, 556A, 556B in the semiconductor layer 522 have a first depth D1 and a first width W1. In one example, the first depth D1 is approximately equal to 1.5 µm and the first width W1 is approximately equal to 120 nm. In other examples, it is appreciated that the widths and depths of such features may have other values.

Figure 5C:
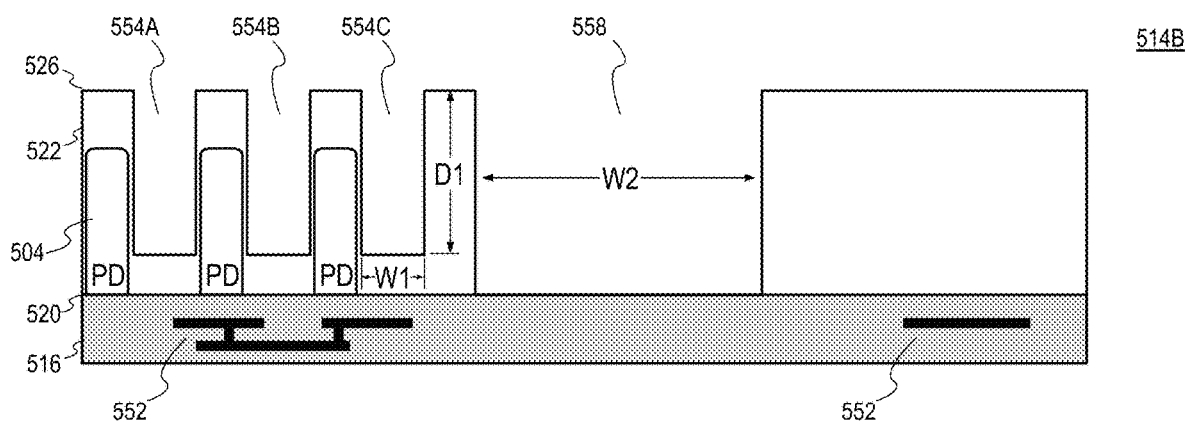

The example shown in FIG. 5C illustrates an example image sensor 514B, which corresponds to the example image sensor 414 of FIG. 4. As shown, FIG. 5C depicts etching a plurality of trenches 554A, 554B, 554C, 556A, 556B in the semiconductor layer 522. A pixel region portion of the plurality of trenches 554A, 554B, 554C is etched in a pixel region 516 of the semiconductor layer 522. In one example, the plurality of trenches 554A, 554B, 554C in the semiconductor layer 522 have a first depth D1 and a first width W1. In one example, the first width W1 is approximately equal to 120 nm and the first depth D1 is approximately equal to 1.5 µm. An edge region portion 558 of the plurality of trenches is etched in an edge region 518 of the semiconductor layer 518 outside of the pixel region 516 of the semiconductor layer 522. In one example, the edge region portion 558 of the plurality of trenches has a depth that extends the entire thickness between the backside 526 and the front side 520 of the semiconductor layer 522. In the example, the edge region portion 558 of the plurality of trenches has a second width W2, which in one example is in the range of 1 to 40 µm. In other examples, it is appreciated that the widths and depths of such features may have other values.

Figure 5D:
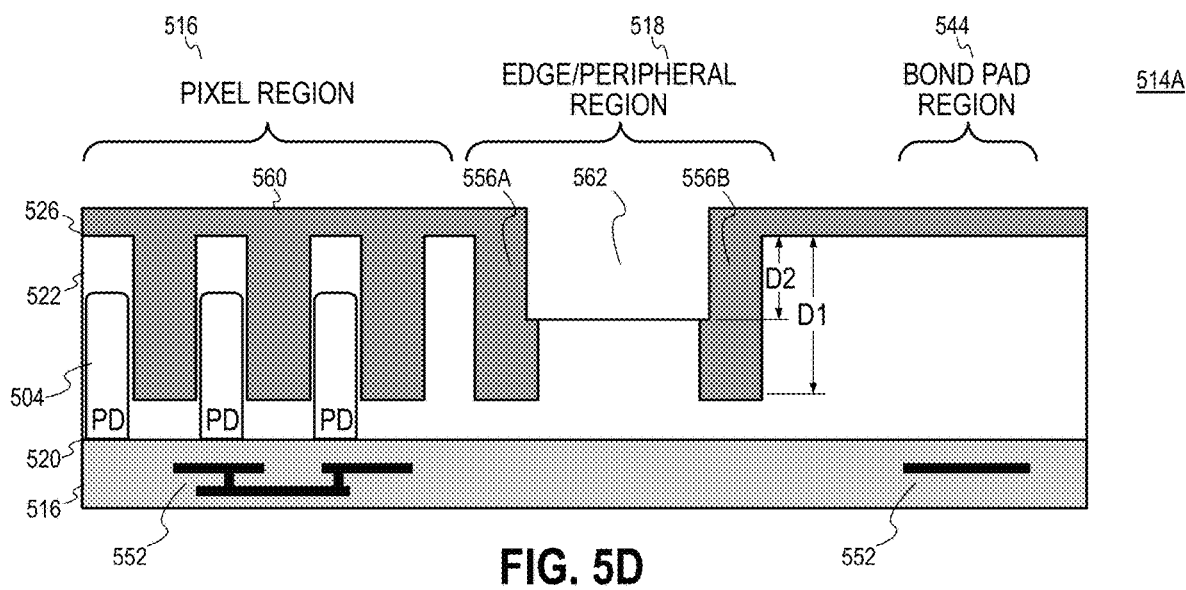

The example shown in FIG. 5D illustrates the example image sensor 514A, which corresponds to the example image sensor 314 of FIG. 3A. As shown, FIG. 5D depicts patterning a photoresist layer 560 over the backside 526 of the semiconductor layer 522 and etching a second edge region trench 562 in the edge region 518 of the semiconductor layer 522 having a second depth D2 from the backside 526 of the semiconductor layer 522. As shown in the example, the second edge region trench 562 overlaps the edge region portion of the plurality of trenches 556A, 556B in the edge region 518 of the semiconductor layer 522. As shown in the example, the second depth D2 is less than the first depth D1.

Figure 5E:
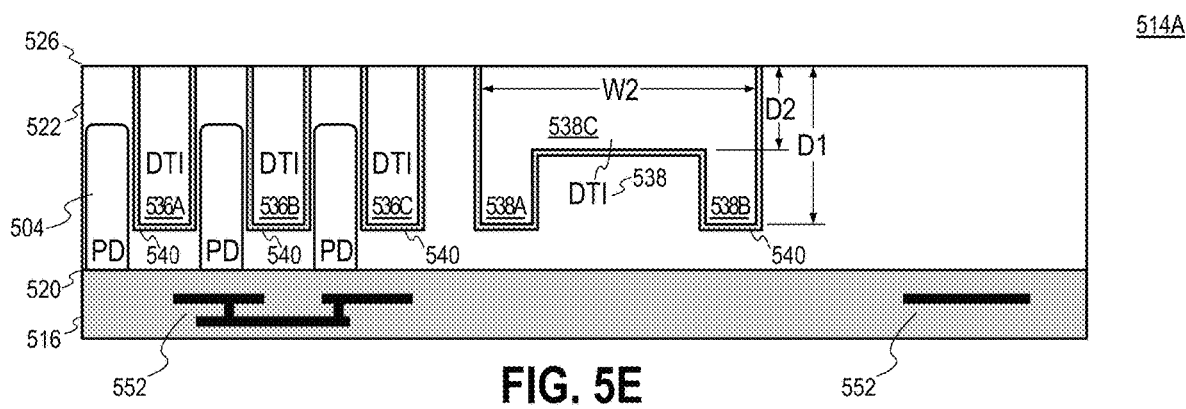

The example shown in FIG. 5E illustrates the example image sensor 514A, which corresponds to the example image sensor 314 of FIG. 3A. As shown, FIG. 5E depicts that the photoresist shown in FIG. 5D has been removed and then forming a DTI structure 536A, 536B, 536C, 538 in the plurality of trenches 554A, 554B, 554C, 556A, 556B, 562. The DTI structure 536A, 536B, 536C, 538 may be formed by forming an oxide layer 540 over the semiconductor layer 522 in the plurality of trenches 554A, 554B, 554C, 556A, 556B, 562 and then filling the plurality of trenches 554A, 554B, 554C, 556A, 556B, 562 with metal over the oxide layer 540 such that the oxide layer 540 is formed between the metal and the semiconductor layer 522. In one example, the metal of the DTI structure 536A, 536B, 536C, 538 may be formed with a suitable metal material (e.g., copper (Cu), aluminum (Al), tungsten (W), or other suitable conductive material). In the various examples, the metal of the edge region portion 538 may be formed with the same type of metal or may be formed with a different type of metal as the other pixel region portions 536A, 536B, 536C of the DTI structure.

Figure 5F:
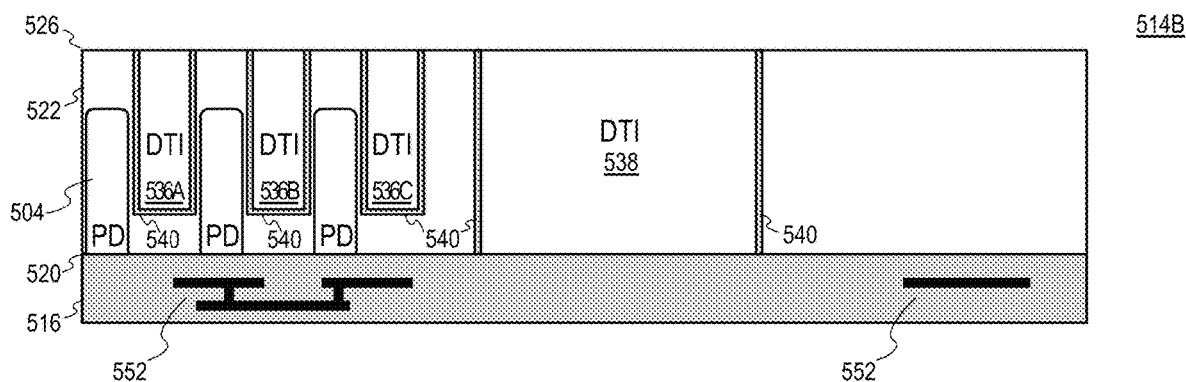

The example shown in FIG. 5F illustrates the example image sensor 514B, which corresponds to the example image sensor 414 of FIG. 4. Similar to example of FIG. 5E, the processing illustrated in FIG. 5F depicts forming a DTI structure 536A, 536B, 536C, 538 in the plurality of trenches 554A, 554B, 554C, 556A, 556B, 558. The DTI structure 536A, 536B, 536C, 538 may be formed by forming an oxide layer 540 over the semiconductor layer 522 in the plurality of trenches 554A, 554B, 554C, 558 and then filling the plurality of trenches 554A, 554B, 554C, 558 with metal over the oxide layer 540 such that the oxide layer 540 is formed between the metal and the semiconductor layer 522.

Figure 5G:
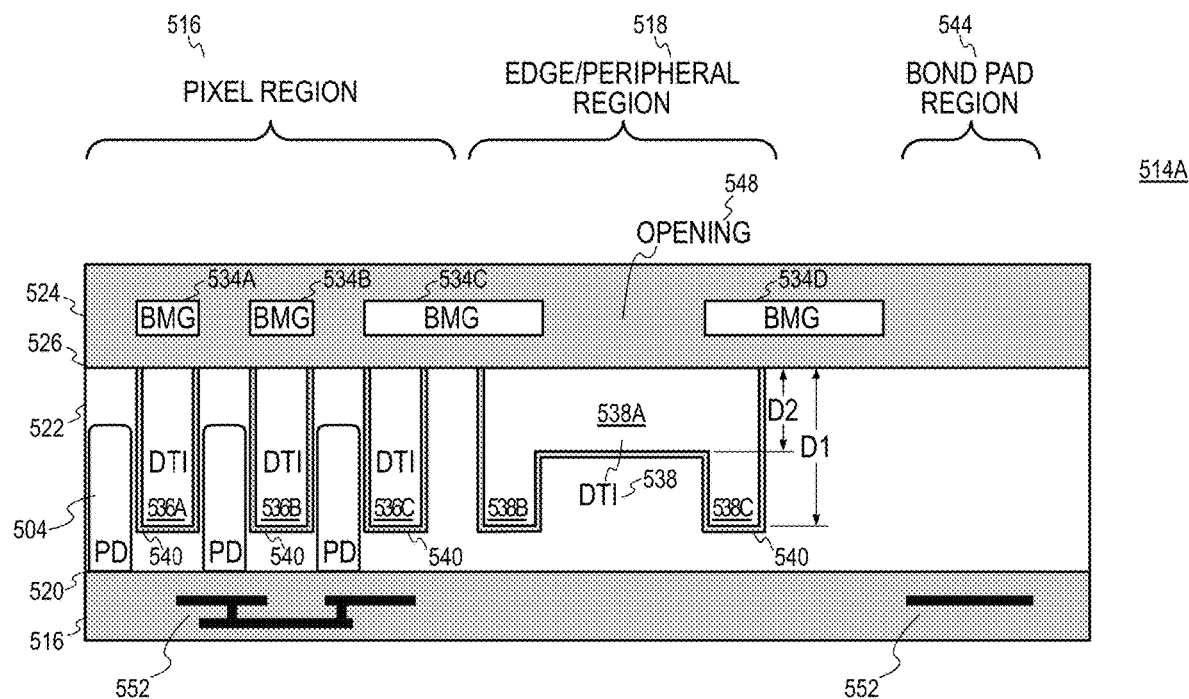
Figure 5H:
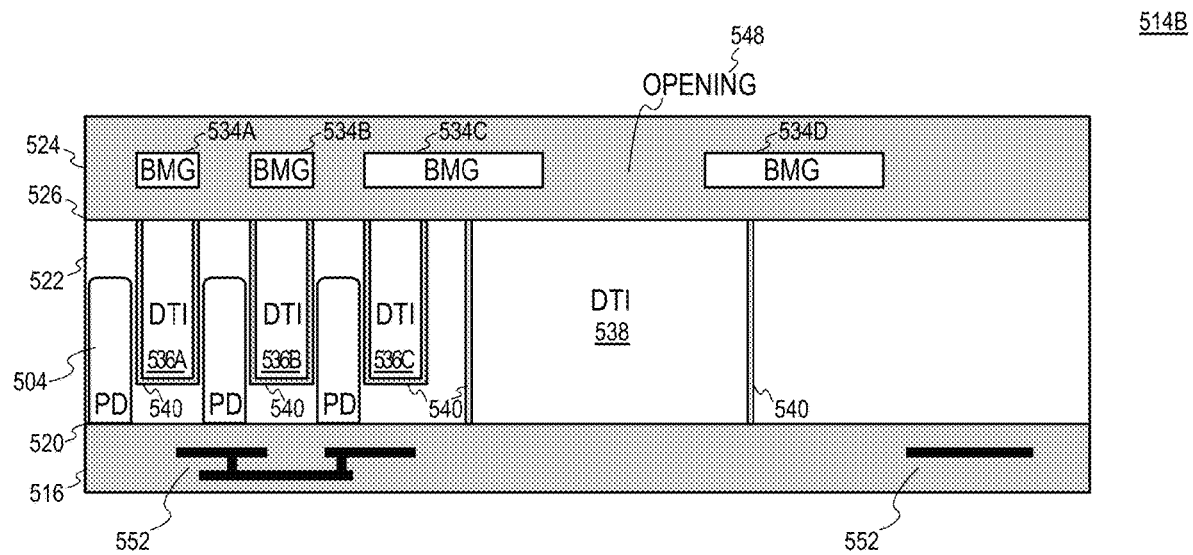

The example shown in FIG. 5G illustrates the example image sensor 514A, which corresponds to the example image sensor 314 of FIG. 3A, while the example shown in FIG. 5H illustrates the example image sensor 514B, which corresponds to the example image sensor 414 of FIG. 4. Both FIGS. 5G-5H depict forming a backside metal grating 534A, 534B, 534C, 534D in a backside oxide layer 524 formed proximate to the backside 526 of the semiconductor layer 522. The depicted examples show that the backside metal grating includes a plurality of pixel region portions 534A, 534B, 534C and an edge region portion 534C, 534D. The plurality of pixel region portions 534A, 534B, 534C of the backside metal grating is disposed proximate to the pixel region 516 of the semiconductor layer 522, and the edge region portion 534C, 534D of the backside metal grating is disposed proximate to the edge region 518 of the semiconductor layer 522. The depicted examples also illustrate that an opening 548 or window is formed in the backside metal grating in the backside oxide layer 524 between portions 534C and 534D.

Figure 5I:
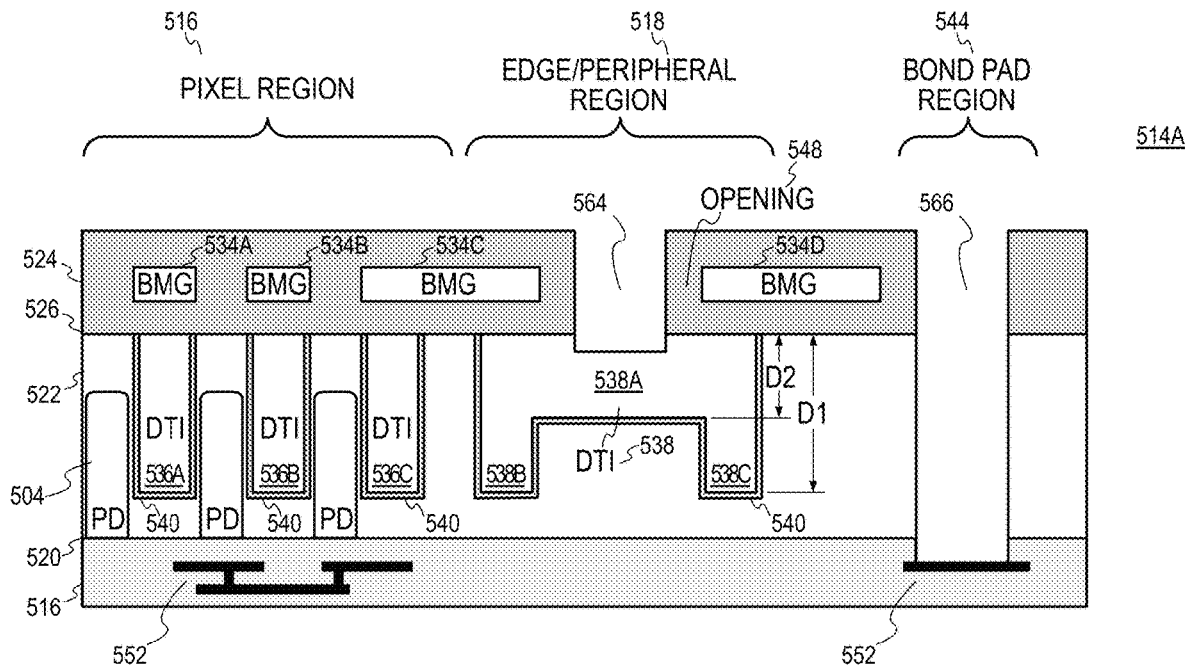
Figure 5J:
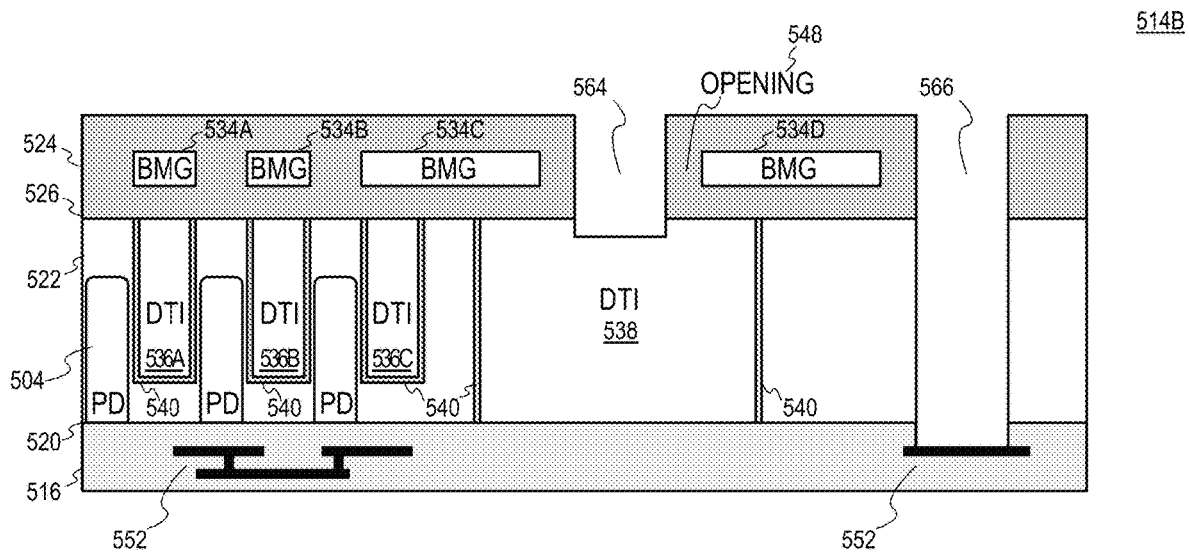

The example shown in FIG. 5I illustrates the example image sensor 514A, which corresponds to the example image sensor 314 of FIG. 3A, while the example shown in FIG. 5J illustrates the example image sensor 514B, which corresponds to the example image sensor 414 of FIG. 4. Both FIGS. 5I-5J depict etching an edge DTI trench 564 through the backside oxide layer 524 and through the opening 548 in the edge region portion 534C, 534D of the backside metal grating to an edge portion 538 of the DTI structure in the edge region 518 of the semiconductor layer 522. The depicted examples also illustrate etching a bond pad trench 566 through the backside oxide layer 524 and through the semiconductor layer 522 into the dielectric layer 516 to a metal layer 552 in the bond pad region 544.

It is appreciated that after the edge DTI trench 564 and the bond pad trench 566 have been etched as shown in FIG. 5I, FIG. 3A may be referred to again, which shows that processing includes forming an edge DTI contact 342 in edge trench 564 of FIG. 5I. As shown in FIG. 3A, edge DTI contact 342 is then coupled to the edge region portion 338 of the DTI structure through the opening 348 in the edge region portion 334C, 334D of the backside metal grating in the backside oxide layer 324. Processing may further include forming a bond pad contact 346 in bond pad trench 566 of FIG. 5I. As shown, bond pad contact 346 therefore extends through the semiconductor layer 322 between the backside oxide layer 324 at the backside 326 and a metal layer 352 in the dielectric layer 316 at the front side 320. In addition, processing also includes forming a color filter array 328 over the backside oxide layer 324 and over the plurality of pixel region portions 334A, 334B, 334C of the backside metal grating and forming a plurality of microlenses 330 over the color filter array 328.

Similarly, it is noted that after the edge DTI trench 564 and the bond pad trench 566 have been etched as shown in FIG. 5J, FIG. 4 may be referred to again, which shows that processing includes forming an edge DTI contact 442 in edge trench 564 of FIG. 5J. As shown in FIG. 4, edge DTI contact 442 is then coupled to the edge region portion 438 of the DTI structure through the opening 448 in the edge region portion 434C, 434D of the backside metal grating in the backside oxide layer 424. Similarly, processing may further include forming a bond pad contact 446 in bond pad trench 566 of FIG. 5J. As shown in FIG. 4, bond pad contact 446 therefore extends through the semiconductor layer 422 between the backside oxide layer 424 at the backside 426 and a metal layer 452 in the dielectric layer 416 at the front side 420. In addition, processing also includes forming a color filter array 428 over the backside oxide layer 424 and over the plurality of pixel region portions 434A, 434B, 434C of the backside metal grating and forming a plurality of microlenses 430 over the color filter array 428.

Figure 6:
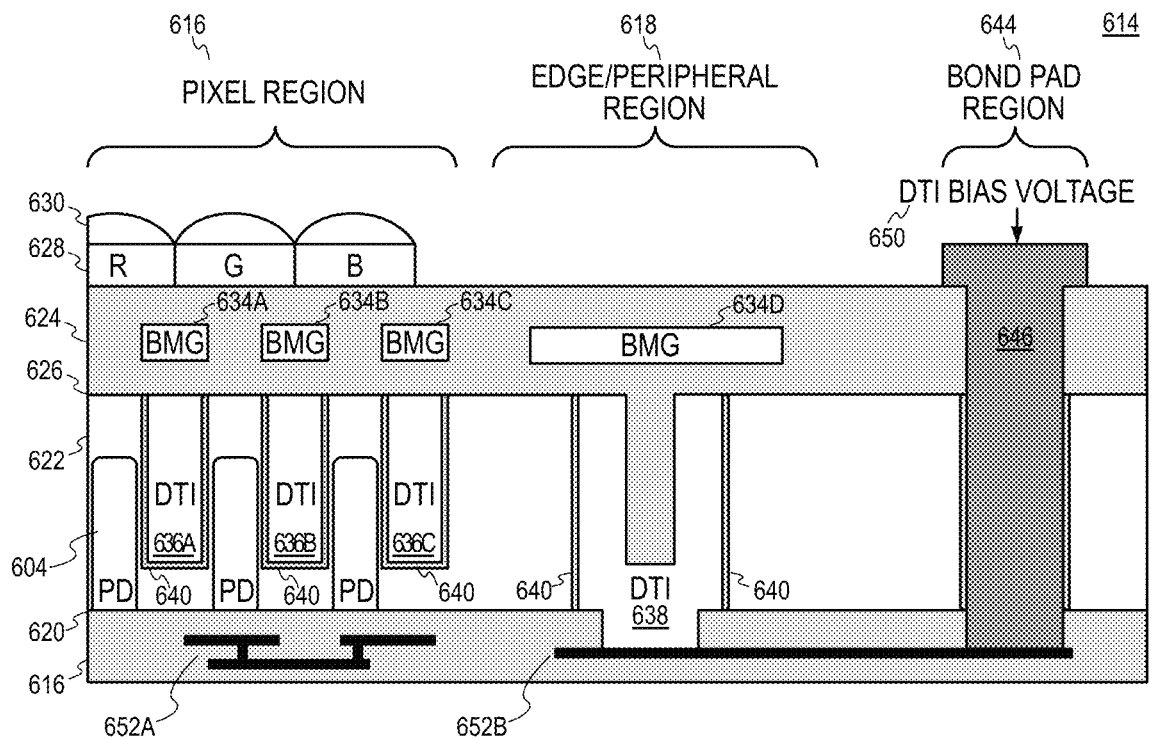
FIG. 6 is a cross-section view illustrating still another example of an image sensor including a biased deep trench isolation structure in accordance with the teachings of the present invention.

FIG. 6 is a cross-section view illustrating still another example of an image sensor 614 including a biased DTI structure in accordance with the teachings of the present invention. It is noted that example image sensor 614 of FIG. 6 may be another example of the image sensor 214 including the photodiodes 204 of the pixel circuitry of FIG. 2 and/or the example image sensor including the pixel cells 104 of the example pixel array 102 of FIG. 1, and it should be appreciated that similarly named and numbered elements referenced below are coupled and function as described above. It is further noted that image sensor 614 of FIG. 6 shares many similarities with image sensor 314 of FIGS. 3A-3C and with image sensor 414 of FIG. 4.

For instance, as shown in the example depicted in FIG. 6, image sensor 614 also includes a plurality of photodiodes 604 included in pixel circuitry, which are formed proximate to a front side 620 in a pixel region 616 of a semiconductor layer 622. The image sensor 614 further includes a backside oxide layer 624 disposed proximate to a backside 626 of the semiconductor layer 622. A backside metal grating (BMG) is formed in the backside oxide layer 624. As shown in the illustrated example, the BMG includes a plurality of BMG pixel region portions 634A, 634B, 634C in the pixel region 616. In one example, the BMG further includes a portion 634D that is in an edge region 618 or peripheral region that is outside of the pixel region 616.

In the example, a color filter array (CFA) 628 is formed over the backside oxide layer 624, and microlenses (ML) 630 are formed over the CFA 628 in the pixel region 616. A dielectric layer 616 is disposed proximate to the front side 620 of the semiconductor layer 622. In the example, the dielectric layer 616 is an interlayer dielectric in which a plurality of metal layers 652A, 652B are formed to provide circuit connections for the circuitry included in the semiconductor layer 622. In addition, one of the metal layers 652B may also be coupled to a DTI bias voltage 650, which may be utilized to bias a DTI structure of image sensor 614 through the front side 620 of semiconductor layer 622.

In particular, the example illustrated in FIG. 6 shows that image sensor 614 includes a DTI structure formed in the semiconductor layer 622. The DTI structure includes a plurality of pixel region portions 636A, 636B, 636C, and an edge region portion 638. The plurality of pixel region portions 636A, 636B, 636C of the DTI structure is disposed in the pixel region 616 of the semiconductor layer 622.

As shown in the depicted example, each of the plurality of pixel region portions 636A, 636B, 636C of the DTI structure is disposed in the pixel region 616 and is aligned with the ML 638, CFA 628, BMG pixel region portions 634A, 634B, 634C and photodiodes 604 in the semiconductor layer 622 such that incident light is directed through the ML 630, CFA 628, backside metal grating 634A, 634B, 634C, through the backside 626, and between the plurality of pixel region portions 636A, 636B, 636C of the DTI structure to the photodiodes 604 of the pixel circuitry at the front side 620 of the semiconductor layer 622.

The example image sensor 614 of FIG. 6 also includes an edge region portion 638 of the DTI structure that is disposed in an edge region 618 of the semiconductor layer 622, which is outside of the pixel region 616 of the semiconductor layer 622. One difference between the image sensor 614 of FIG. 6 and the image sensor 414 of FIG. 4 and the image sensor 314 of FIG. 3A is that the edge region portion 638 of the DTI structure in image sensor 614 extends from between the backside 626 and the front side 620 of the semiconductor layer 622, and further extends from the front side 620 of the semiconductor layer 622 to one of the plurality of metal layers 652B formed in the dielectric layer 616. In one example, it is noted that a portion of the backside oxide layer 624 may also optionally extend into an interior of the metal in the edge region portion 638 of the DTI structure from the backside 626 of the semiconductor layer towards the front side 620 of the semiconductor layer 622.

In the illustrated example, it is noted that there may also be a bond pad region 644 at the side of the image sensor 614 as shown. In one example, the bond pad region 644 includes a bond pad contact 646 that extends through the semiconductor layer 622 between the backside oxide layer 624 at the backside 626 and a metal layer 652B in the dielectric layer 616 at the front side 620. In the example, the edge region 618 is between the pixel region 616 and the bond pad region 644 as shown. In the example depicted in FIG. 6, the bond pad contact 646 is coupled to metal layer 652B and is coupled to receive the DTI bias voltage 650 as shown.

As mentioned above, the edge region portion 638 of the DTI structure is coupled to be biased with the DTI bias voltage 650 through metal layer 652B, which creates an electric field with DTI structure 636A, 636B, 636C, 638 in the semiconductor layer 622 that reduces dark current (DC) and/or white pixels (WP) in the image sensor 614 in accordance with the teachings of the present invention. In one example, the DTI bias voltage 650 is a negative voltage.

In the various examples, the DTI structure including pixel region portions 636A, 636B, 636C and edge region portion 638 are formed with a suitable metal material (e.g., copper (Cu), aluminum (Al), tungsten (W), or other suitable conductive material) with an oxide layer 640 disposed between the metal material of the DTI structure and the semiconductor material (e.g., silicon (Si)) of the semiconductor layer 622. In the various examples, the metal of the edge region portion 638 may be formed with the same type of metal or may be formed with a different type of metal as the other pixel region portions 636A, 636B, 636C of the DTI structure.

Figure 7:
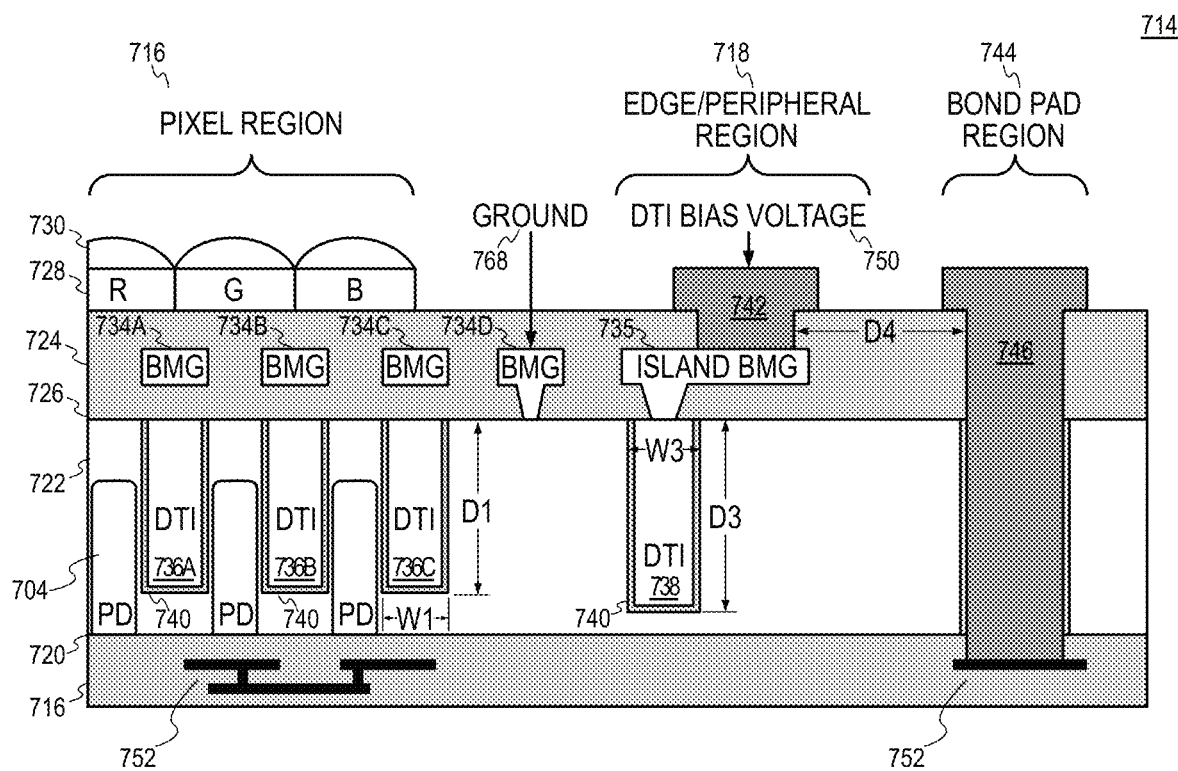
FIG. 7 is a cross-section view illustrating yet another example of an image sensor including a biased deep trench isolation structure in accordance with the teachings of the present invention.

FIG. 7 is a cross-section view illustrating yet another example of an image sensor 714 including a biased DTI structure in accordance with the teachings of the present invention. It is noted that example image sensor 714 of FIG. 4 may be another example of the image sensor 214 including the photodiodes 204 of the pixel circuitry of FIG. 2 and/or the example image sensor including the pixel cells 104 of the example pixel array 102 of FIG. 1, and it should be appreciated that similarly named and numbered elements referenced below are coupled and function as described above. shares many similarities with image sensor 314 of FIGS. 3A-3C, image sensor 414 of FIG. 4, and image sensor 614 of FIG. 6.

For instance, as shown in the example depicted in FIG. 7, image sensor 714 also includes a plurality of photodiodes 704 included in pixel circuitry, which are formed proximate to a front side 720 in a pixel region 716 of a semiconductor layer 722. The image sensor 714 further includes a backside oxide layer 724 disposed proximate to a backside 726 of the semiconductor layer 722. A backside metal grating (BMG) is formed in the backside oxide layer 724. As shown in the illustrated example, the BMG includes a plurality of BMG pixel region portions 734A, 734B, 734C in the pixel region 716.

One of the differences between image sensor 714 and the examples described previously is that as shown in the illustrated example, the BMG further includes portions 734D and 735, which are outside of the pixel region 716. In one example, BMG portion 735 is an "islanded" BMG portion that is in the edge region 718 and is electrically isolated from the other BMG portions 734A, 734B, 734C, 734D. In other words, in one example, the BMG portion 735 is an "island" that is separated and electrically isolated from the other BMG portions 734A, 734B, 734C, 734D in the backside oxide layer 724. Thus, in one example, BMG portions 734A, 734B, 734C, 734D may be coupled to ground 768 while island BMG portion 735 may be coupled to a different voltage, such as DTI bias voltage 750.

In the example, a color filter array (CFA) 728 is formed over the backside oxide layer 724, and microlenses (ML) 730 are formed over the CFA 728 in the pixel region 716. A dielectric layer 716 is disposed proximate to the front side 720 of the semiconductor layer 722. In the example, the dielectric layer 716 is an interlayer dielectric in which a plurality of metal layers 752 are formed to provide circuit connections for the circuitry included in the semiconductor layer 722.

Similar to the previously described examples, the example image sensor 714 illustrated in FIG. 7 also includes a DTI structure formed in the semiconductor layer 722. The DTI structure includes a plurality of pixel region portions 736A, 736B, 736C, and an edge region portion 738. The plurality of pixel region portions 736A, 736B, 736C of the DTI structure is disposed in the pixel region 716 of the semiconductor layer 722. In one example, the plurality of pixel region portions 736A, 736B, 736C have a first width W1 and extend a first depth D1 into the semiconductor layer 722 from the backside 726 towards the front side 720. In one example, the first width W1 is approximately equal to 120 nm and the first depth D1 is approximately equal to 1.5 μm. In other examples, it is appreciated that the widths and depths of such features may have other values.

As shown in the depicted example, each of the plurality of pixel region portions 736A, 736B, 736C of the DTI structure is disposed in the pixel region 716 and aligned with the ML 738, CFA 728, BMG pixel region portions 734A, 734B, 734C and photodiodes 704 in the semiconductor layer 722 such that incident light is directed through the ML 730, CFA 728, backside metal grating 734A, 734B, 734C, through the backside 726, and between the plurality of pixel region portions 736A, 736B, 736C of the DTI structure to the photodiodes 704 of the pixel circuitry at the front side 720 of the semiconductor layer 722.

The example image sensor 714 of FIG. 7 also includes an edge region portion 738 of the DTI structure that is disposed in an edge region 718 of the semiconductor layer 722, which is outside of the pixel region 716 of the semiconductor layer 722. One difference between the image sensor 714 of FIG. 7 and the image sensor 314 of FIG. 3A is that the edge region portion 738 of the DTI structure in image sensor 714 has a third width W3 and a third depth D3 into the semiconductor layer 722 from the backside 726 towards the front side 720. In one example, the third width W3 is greater than or equal to the first width W1 or greater than or equal to approximately 120 nm and the third depth D3 is greater than or equal to the first depth D1 or greater than or equal to 1.5 μm. In other examples, it is appreciated that the widths and depths of such features may have other values.

Another one of the differences between image sensor 714 and the examples described previously is that as shown in the illustrated example, the island BMG portion 735 is coupled to the edge region portion 738 of the DTI structure through the backside oxide layer 724. Example image sensor 714 also includes an edge DTI contact 742, which is coupled to the island BMG portion 735 and therefore coupled to edge region portion 738 of the DTI structure through backside oxide layer 724.

In one example, the edge DTI contact 724 is coupled receive DTI bias voltage 750 that creates an electric field with edge region portion 738 of the DTI structure in the semiconductor layer 722, which reduces dark current (DC) and/or white pixels (WP) in the image sensor 714 in accordance with the teachings of the present invention. In one example, the DTI bias voltage 750 is a negative voltage. In one example, BMG portion 734D, which is electrically isolated from island BMG portion 735, is coupled to ground 768 and is also coupled to the semiconductor layer 722 to ground the substrate of semiconductor layer 722.

In the various examples, the DTI structure including pixel region portions 736A, 736B, 736C and edge region portion 738 are formed with a suitable metal material (e.g., copper (Cu), aluminum (Al), tungsten (W), or other suitable conductive material) with an oxide layer 740 disposed between the metal material of the DTI structure and the semiconductor material (e.g., silicon (Si)) of the semiconductor layer 722. In the various examples, the metal of the edge region portion 738 may be formed with the same type of metal or may be formed with a different type of metal as the other pixel region portions 736A, 736B, 736C of the DTI structure.

In the illustrated example, it is noted that there may also be a bond pad region 744 at the side of the image sensor 714 as shown. In one example, the bond pad region 744 includes a bond pad contact 746 that extends through the semiconductor layer 722 between the backside oxide layer 724 at the backside 726 and a metal layer 752 in the dielectric layer 716 at the front side 720. In the example, the edge region 718 is between the pixel region 716 and the bond pad region 744 as shown. In one example, the edge contact 742 is separated from the bond pad contact 746 by a distance D4. In one example, the distance D4 is greater than 200 nm.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of photodiodes disposed in a pixel region of a semiconductor layer and proximate to a front side of the semiconductor layer to generate image charge in response to incident light;
   a backside oxide layer disposed proximate to a backside of the semiconductor layer;
   a backside metal grating formed in the backside oxide layer; and
   a deep trench isolation (DTI) structure formed in the semiconductor layer, wherein the DTI structure includes a plurality of pixel region portions and an edge region portion,
   wherein the plurality of pixel region portions of the DTI structure is disposed in the pixel region of the semiconductor layer such that the incident light is directed through the backside metal grating, through the backside of the semiconductor layer, and between the plurality of pixel region portions of the DTI structure to the plurality of photodiodes,
   wherein the edge region portion of the DTI structure is disposed in an edge region of the semiconductor layer outside of the pixel region of the semiconductor layer, wherein the edge region portion of the DTI structure is coupled to be biased with a DTI bias voltage.

2. The image sensor of claim 1, wherein the DTI structure comprises metal with an oxide layer formed between the metal of the DTI structure and the semiconductor layer.

3. The image sensor of claim 2, wherein the DTI bias voltage is a negative voltage.

4. The image sensor of claim 1, wherein the backside metal grating includes a plurality of pixel region portions and an edge region portion, wherein the plurality of pixel region portions of the backside metal grating is disposed proximate to the pixel region of the semiconductor layer, and wherein the edge region portion of the backside metal grating is disposed proximate to the edge region of the semiconductor layer.

5. The image sensor of claim 4, wherein the incident light is directed through the plurality of pixel region portions of the backside metal grating, through the backside of the semiconductor layer, and between the plurality of pixel region portions of the DTI structure to the plurality of photodiodes.

6. The image sensor of claim 4, further comprising an edge DTI contact coupled to the edge region portion of the DTI structure through an opening in the edge region portion of the backside metal grating in the backside oxide layer and through the backside of the semiconductor layer, wherein the edge region portion of the DTI structure is coupled to be biased with the DTI bias voltage through the edge DTI contact.

7. The image sensor of claim 6, wherein the edge region portion of the DTI structure comprises a plurality of first portions and a second portion,
  wherein each of the plurality of first portions of the edge region portion of the DTI structure extends a first depth from the backside of the semiconductor layer towards the front side of the semiconductor layer,
  wherein the second portion of the edge region portion of the DTI structure extends a second depth from the backside of the semiconductor layer towards the front side of the semiconductor layer,
  wherein the first depth is greater than the second depth.

8. The image sensor of claim 7, wherein both the first depth and the second depth are less than a total thickness of the semiconductor layer between the backside and the front side of the semiconductor layer.

9. The image sensor of claim 6, wherein the edge region portion of the DTI structure extends between the backside and the front side of the semiconductor layer.

10. The image sensor of claim 4, wherein the edge region portion of the DTI structure extends between the backside and the front side of the semiconductor layer.

11. The image sensor of claim 10, wherein the image sensor further comprises:
  a dielectric layer disposed proximate to the front side of the semiconductor layer; and
  a plurality of metal layers formed in the dielectric layer.

12. The image sensor of claim 11, wherein the edge region portion of the DTI structure further extends from the front side of the semiconductor layer to one of the plurality of metal layers formed in the dielectric layer, wherein the edge region portion of the DTI structure is coupled to be biased with the DTI bias voltage through said one of the plurality of metal layers formed in the dielectric layer.

13. The image sensor of claim 12, further comprising a bond pad contact formed through a bond pad region of the semiconductor layer, wherein the bond pad region of the semiconductor layer is outside the edge region of the semiconductor layer and outside of the pixel region of the semiconductor layer, wherein the bond pad contact extends through the semiconductor layer between the backside oxide layer and said one of the plurality of metal layers formed in the dielectric layer, wherein the bond pad contact is coupled to receive the DTI bias voltage.

14. The image sensor of claim 12, wherein a portion of the backside oxide layer extends into an interior of the edge region portion of the DTI structure from the backside of the semiconductor layer towards the front side of the semiconductor layer.

15. The image sensor of claim 4, wherein the edge region portion of the backside metal grating is electrically isolated from the plurality of pixel region portions of the backside metal grating.

16. The image sensor of claim 15, further comprising an edge DTI contact coupled to the edge region portion of the backside metal grating through the backside oxide layer, wherein the edge region portion of the backside metal grating is further coupled to the edge region portion of the DTI structure through the backside oxide layer, wherein the edge region portion of the DTI structure is coupled to be biased with the DTI bias voltage through the edge DTI contact and through the edge region portion of the backside metal grating through the backside oxide layer.

17. The image sensor of claim 16, further comprising a bond pad contact formed through a bond pad region of the semiconductor layer, wherein the bond pad region of the semiconductor layer is outside the edge region of the semiconductor layer and outside of the pixel region of the semiconductor layer, wherein the edge DTI contact is separated from the bond pad contact by at least 200 µm.

18. The image sensor of claim 15, wherein at least one of the plurality of pixel region portions of the backside metal grating is coupled to the semiconductor layer outside of the pixel region of the semiconductor layer.

19. The image sensor of claim 5, further comprising:
  a color filter array disposed over the backside oxide layer and over the plurality of pixel region portions of the backside metal grating; and
  a plurality of microlenses disposed over the color filter array, wherein the incident light is further directed through the plurality of microlenses and through the color filter array to the plurality of photodiodes.

20. An imaging system, comprising:
  a pixel array formed in a semiconductor layer, wherein the pixel array includes:
    pixel circuitry including a plurality of photodiodes disposed in a pixel region of the semiconductor layer and proximate to a front side of the semiconductor layer to generate image charge in response to incident light;
    a backside oxide layer disposed proximate to a backside of the semiconductor layer;
    a backside metal grating formed in the backside oxide layer; and
    a deep trench isolation (DTI) structure formed in the semiconductor layer, wherein the DTI structure includes a plurality of pixel region portions and an edge region portion,
    wherein the plurality of pixel region portions of the DTI structure is disposed in the pixel region of the semiconductor layer such that the incident light is directed through the backside metal grating, through the backside of the semiconductor layer, and between the plurality of pixel region portions of the DTI structure to the plurality of photodiodes,
    wherein the edge region portion of the DTI structure is disposed in an edge region of the semiconductor layer outside of the pixel region of the semiconductor layer, wherein the edge region portion of the DTI structure is coupled to be biased with a DTI bias voltage;

control circuitry coupled to the pixel array to control operation of the pixel array; and readout circuitry coupled to the pixel array to readout image data from the pixel array.

21. The imaging system of claim 20, further comprising function logic coupled to the readout circuitry to store the image data readout from the pixel array.

22. The imaging system of claim 20, wherein the DTI structure comprises metal with an oxide layer formed between the metal of the DTI structure and the semiconductor layer.

23. The imaging system of claim 22, wherein the DTI bias voltage is a negative voltage.

24. The imaging system of claim 20, wherein the backside metal grating includes a plurality of pixel region portions and an edge region portion, wherein the plurality of pixel region portions of the backside metal grating is disposed proximate to the pixel region of the semiconductor layer, and wherein the edge region portion of the backside metal grating is disposed proximate to the edge region of the semiconductor layer.

25. The imaging system of claim 24, wherein the incident light is directed through the plurality of pixel region portions of the backside metal grating, through the backside of the semiconductor layer, and between the plurality of pixel region portions of the DTI structure to the plurality of photodiodes.

26. The imaging system of claim 24, wherein the pixel array further comprises an edge DTI contact coupled to the edge region portion of the DTI structure through an opening in the edge region portion of the backside metal grating in the backside oxide layer and through the backside of the semiconductor layer, wherein the edge region portion of the DTI structure is coupled to be biased with the DTI bias voltage through the edge DTI contact.

27. The imaging system of claim 26, wherein the edge region portion of the DTI structure comprises a plurality of first portions and a second portion, wherein each of the plurality of first portions of the edge region portion of the DTI structure extends a first depth from the backside of the semiconductor layer towards the front side of the semiconductor layer, wherein the second portion of the edge region portion of the DTI structure extends a second depth from the backside of the semiconductor layer towards the front side of the semiconductor layer, wherein the first depth is greater than the first depth.

28. The imaging system of claim 27, wherein both the first depth and the second depth are less than a total thickness of the semiconductor layer between the backside and the front side of the semiconductor layer.

29. The imaging system of claim 26, wherein the edge region portion of the DTI structure extends between the backside and the front side of the semiconductor layer.

30. The imaging system of claim 24, wherein the edge region portion of the DTI structure extends between the backside and the front side of the semiconductor layer.

31. The imaging system of claim 30, wherein the pixel array further comprises:

a dielectric layer disposed proximate to the front side of the semiconductor layer; and a plurality of metal layers formed in the dielectric layer.

32. The imaging system of claim 31, wherein the edge region portion of the DTI structure further extends from the front side of the semiconductor layer to one of the plurality of metal layers formed in the dielectric layer, wherein the edge region portion of the DTI structure is coupled to be biased with the DTI bias voltage through said one of the plurality of metal layers formed in the dielectric layer.

33. The imaging system of claim 32, wherein the pixel array further comprises a bond pad contact formed through a bond pad region of the semiconductor layer, wherein the bond pad region of the semiconductor layer is outside the edge region of the semiconductor layer and outside of the pixel region of the semiconductor layer, wherein the bond pad contact extends through the semiconductor layer between the backside oxide layer and said one of the plurality of metal layers formed in the dielectric layer, wherein the bond pad contact is coupled to receive the DTI bias voltage.

34. The imaging system of claim 32, wherein a portion of the backside oxide layer extends into an interior of the edge region portion of the DTI structure from the backside of the semiconductor layer towards the front side of the semiconductor layer.

35. The imaging system of claim 24, wherein the edge region portion of the backside metal grating is electrically isolated from the plurality of pixel region portions of the backside metal grating.

36. The imaging system of claim 35, wherein the pixel array further comprises an edge DTI contact coupled to the edge region portion of the backside metal grating through the backside oxide layer, wherein the edge region portion of the backside metal grating is further coupled to the edge region portion of the DTI structure through the backside oxide layer, wherein the edge region portion of the DTI structure is coupled to be biased with the DTI bias voltage through the edge DTI contact and through the edge region portion of the backside metal grating through the backside oxide layer.

37. The imaging system of claim 35, wherein at least one of the plurality of pixel region portions of the backside metal grating is coupled to the semiconductor layer outside of the pixel region of the semiconductor layer.

38. The imaging system of claim 25, wherein the pixel array further comprises:

a color filter array disposed over the backside oxide layer and over the plurality of pixel region portions of the backside metal grating; and a plurality of microlenses disposed over the color filter array, wherein the incident light is further directed through the plurality of microlenses and through the color filter array to the plurality of photodiodes.

39. A method of forming an image sensor, comprising:

providing a semiconductor layer including a plurality of photodiodes disposed in a pixel region of the semiconductor layer and proximate to a front side of the semiconductor layer to generate image charge in response to incident light;

etching a plurality of trenches in the semiconductor layer, wherein a pixel region portion of the plurality of trenches is etched in a pixel region of the semiconductor layer, wherein an edge region portion of the plurality of trenches is etched in an edge region of the semiconductor layer outside of the pixel region of the semiconductor layer;

forming a deep trench isolation (DTI) structure in the plurality of trenches;

forming a backside metal grating in a backside oxide layer formed proximate to the backside of the semiconductor layer, wherein the backside metal grating includes a plurality of pixel region portions and an edge region portion, wherein the plurality of pixel region portions of the backside metal grating is disposed proximate to the pixel region of the semiconductor layer, and wherein the edge region portion of the backside metal grating is disposed proximate to the edge region of the semiconductor layer;

etching an edge DTI trench through the backside oxide layer and through an opening in the edge region portion of the backside metal grating to an edge portion of the DTI structure in the edge region of the semiconductor layer; and forming an edge DTI contact coupled to the edge region portion of the DTI structure through an opening in the edge region portion of the backside metal grating in the backside oxide layer to the edge portion of the DTI structure.

40. The method of claim 39, further comprising biasing the edge region portion of the DTI structure with a DTI bias voltage through the edge DTI contact.

41. The method of claim 40, wherein the DTI bias voltage is a negative voltage.

42. The method of claim 39, wherein forming the DTI structure comprises:
    forming an oxide layer over the semiconductor layer in the plurality of trenches; and
    filling the plurality of trenches with metal over the oxide layer such that the oxide layer is formed between the metal the semiconductor layer.

43. The method of claim 39, wherein etching the plurality of trenches in the semiconductor layer comprises:
    etching the plurality of trenches in the semiconductor layer to a first depth from a backside of the semiconductor layer, wherein the plurality of trenches etched to the first depth include the pixel region portion of the plurality of trenches in the pixel region of the semiconductor layer, wherein the plurality of trenches etched to the first depth further includes the edge region portion of the plurality of trenches in the edge region of the semiconductor layer; and
    etching a second edge region trench in the edge region of the semiconductor layer having a second depth from the backside of the semiconductor layer, wherein the second edge region trench overlaps the edge region portion of the plurality of trenches in the edge region of the semiconductor layer.

44. The method of claim 43, wherein the first depth is greater than the second depth, and wherein both the first depth and the second depth are less than a total thickness of the semiconductor layer between the backside and the front side of the semiconductor layer.

45. The method of claim 39, wherein etching the plurality of trenches in the semiconductor layer comprises:
    etching the pixel region portion of the plurality of trenches in the pixel region of the semiconductor layer to a first depth from a backside of the semiconductor layer;
    etching the edge region portion of the plurality of trenches in the edge region of the semiconductor layer such that the edge region portion extends between the backside and the front side of the semiconductor layer.

46. The method of claim 39, further comprising directing incident light through the backside metal grating, through the backside of the semiconductor layer, and between the plurality of pixel region portions of the DTI structure to the plurality of photodiodes.

47. The method of claim 46, further comprising:
    forming a color filter array over the backside oxide layer and over the plurality of pixel region portions of the backside metal grating; and
    forming a plurality of microlenses over the color filter array, wherein the incident light is further directed through the plurality of microlenses and through the color filter array to the plurality of photodiodes.

* * * * *